(12) United States Patent
Trichet et al.

(10) Patent No.: US 6,211,747 B1
(45) Date of Patent: Apr. 3, 2001

(54) WIDEBAND MODULATED FRACTIONAL-N FREQUENCY SYNTHESIZER

(75) Inventors: Jacques Trichet, Rousseau; Christophe Fourtet, Pomtignan, both of (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/322,533

(22) Filed: May 28, 1999

(30) Foreign Application Priority Data

May 29, 1998 (EP) .................................................. 98401301

(51) Int. Cl.[7] ....................................................... H03C 3/09
(52) U.S. Cl. ............................................ 332/128; 455/113
(58) Field of Search .................................. 332/127, 128; 455/113

(56) References Cited

U.S. PATENT DOCUMENTS

| | | | |
|---|---|---|---|
| 4,308,508 | * 12/1981 | Sommer et al. | 332/128 |
| 5,021,754 | * 6/1991 | Sheperd et al. | 332/128 |
| 5,166,642 | * 11/1992 | Hietala | 332/127 |
| 5,834,987 | * 11/1998 | Dent | 332/128 |
| 5,983,077 | * 11/1999 | Dent | 332/128 |

* cited by examiner

Primary Examiner—Siegfried H. Grimm
(74) Attorney, Agent, or Firm—Lanny L. Parker

(57) ABSTRACT

A direct modulation multi-accumulator fractional-N frequency synthesizer 1 for generating a carrier signal 150 modulated by a modulation signal 170, 121 is disclosed. The frequency synthesizer includes a Voltage Controlled Oscillator, VCO 50, having a tuning port for controlling the frequency of the signal 110 output by the VCO, a variable divider 20 and a multi-accumulator sequence generator 21 for controlling the variable divider, a reference signal generator 50, a phase detector 30 and a low pass filter 40. These elements are arranged to form a Phase Locked Loop arrangement, the directly modulated output signal of which is taken from the output of the VCO, wherein in-band modulation is performed by varying the variable divider and out-of-band modulation is performed by directly applying the modulating signal to the VCO tuning port.

10 Claims, 1 Drawing Sheet

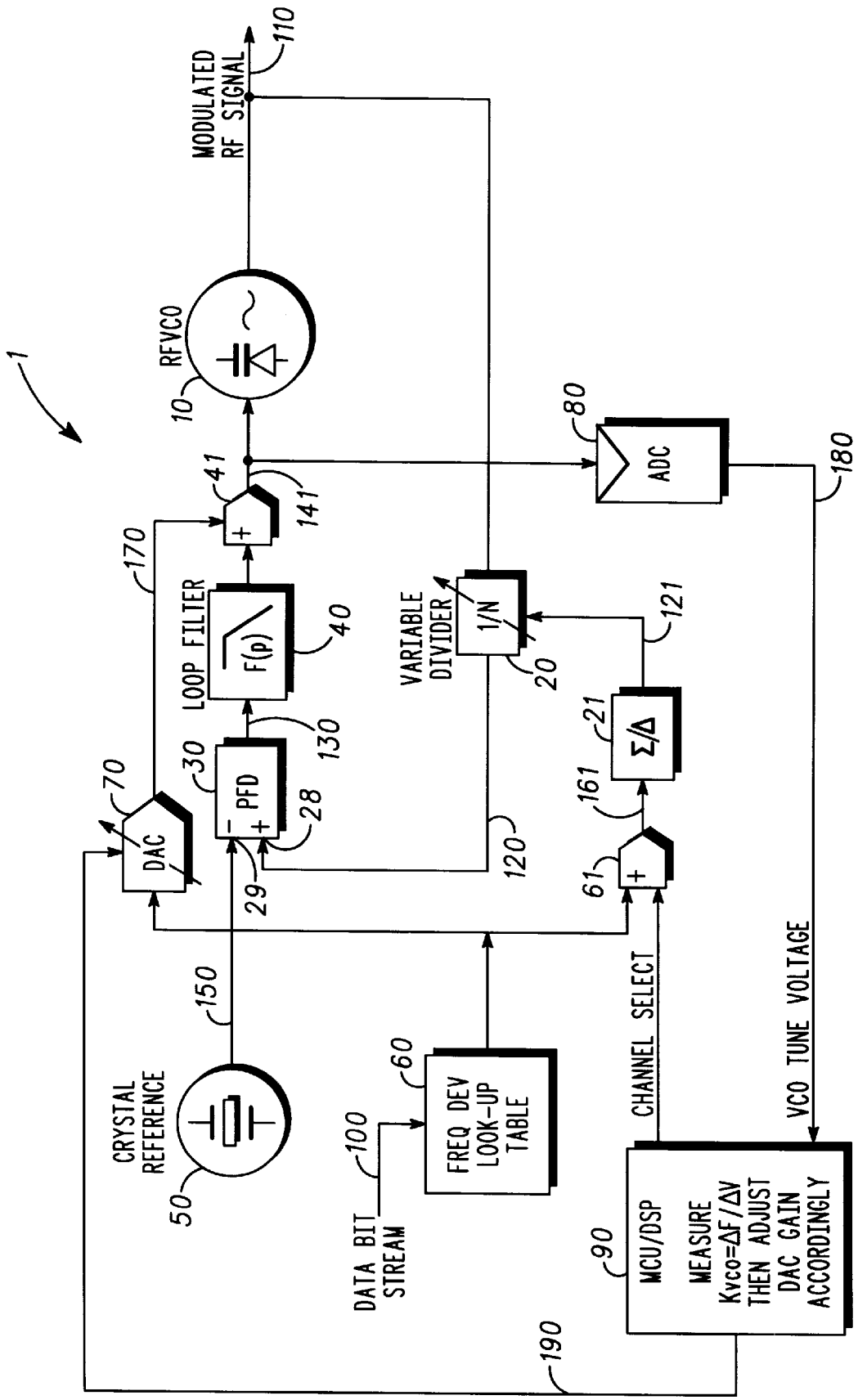

WIDEBAND MODULATED FRACTIONAL-N FREQUENCY SYNTHESIZER

FIELD OF THE INVENTION

The present invention relates to a frequency synthesiser and in particular to a frequency synthesiser suitable for generating wideband modulated radio frequency signals for use in, for example, portable radio communication devices or Wireless Local Area Network (WLAN) systems.

BACKGROUND OF THE INVENTION

Frequency synthesisers have been developed in recent years which permit direct modulation of a carrier signal generated by a Phase Locked Loop (PLL) circuit by rapidly varying the instantaneous value of a variable divider forming part of the PLL circuit; the variable divider is controlled by a digital signal output from a sigma-delta type multi-accumulator digital circuit which acts to shape the noise generated by such a system so that it mostly occurs at higher frequencies where it can be more easily filtered out (by the natural Low Pass Filter behavior of the closed PLL) before transmission of the signal. Such frequency synthesisers are known as direct modulation multi-accumulator fractional-N synthesisers and an example of such a synthesiser is described in U.S. Pat. No. 5,166,642 which is incorporated herein by way of reference.

Such frequency synthesisers are able to produce very well controlled modulation with a low enough Signal to Noise Ratio (SNR)—and in particular Signal to Phase-Noise Ratio—at relatively low modulation frequencies to find many practical applications. However, as a result of the type of noise shaping employed by the multi-accumulator digital circuit, it is difficult to maintain such a low SNR where a higher bandwidth is required for the modulation signal. This is because the noise shaping reduces the amount of low frequency noise at the expense of increasing the amount of high frequency noise. For this reason, multi-accumulator fractional-N frequency synthesisers have not found application in large modulation bandwidth applications to date.

SUMMARY OF THE INVENTION

According to the present invention, there is provided a direct modulation multi-accumulator fractional-N frequency synthesiser for generating a carrier signal modulated by a modulation signal, the frequency synthesiser comprising a Voltage Controlled Oscillator, VCO, having a tuning port for controlling the frequency of the signal output by the VCO, a variable divider and a multi-accumulator sequence generator for controlling the variable divider, a reference signal generator, a phase detector and a low pass filter, these elements being arranged to form a Phase Locked Loop arrangement, the directly modulated output signal of which is taken from the output of the VCO, wherein in-band modulation is performed by varying the variable divider and out-of-band modulation is performed by directly applying the modulating signal to the VCO tuning port.

It will be understood by a person skilled in the art of radio frequency synthesisers that in-band modulation refers to modulation of the carrier frequency by components of the entire modulation signal whose frequency does not exceed the corner frequency of the low pass filter, while out-of-band modulation refers to modulation of the carrier frequency by components of the entire modulation signal whose frequency does exceed the corner frequency of the low pass filter. Actually, this is only an approximate definition since other components within the PLL arrangement will have low pass filtering characteristics in addition to the low pass filter itself, and corner frequencies themselves represent an arbitrary cut-off point for what is actually a smooth transition. None-the-less, as will be understood by persons skilled in the art, the precise definition of in-band or out-of-band modulation is especially unimportant in the present invention, provided the two definitions are complimentary, since the transfer characteristics of the out-of-band modulation will be complimentary to the transfer characteristics of the in-band modulation as a direct result of the nature of the present invention.

It is significant that all in-band modulation is performed directly by varying the variable divider (i.e. varying the instantaneous value of the divisor of the variable divider), since this is a purely digital process and can thus be very accurately controlled. Furthermore, the fact that the in-band modulation is performed in a purely digital manner is also significant for enabling accurate control of the relative delays between the in-band and out-of-band modulation paths which is a significant advantage of the present invention.

Preferably, the modulating signal is provided as a digital signal both to the sequence generator and to a Digital to Analogue Converter, DAC, the output of which is combined with the output from the low pass filter before being applied to the VCO tuning port. Preferably the DAC has a variable gain which is preferably controllable by means of a suitable digital control signal.

This enables the modulating signal to be transmitted to be maintained in a digital format for a desirably large number of the signal processing steps prior to transmission.

Preferably, the digital modulating signal is provided by a look-up table to which a bit stream is input. Such an arrangement not only provides a much better control over the modulation signal than can be achieved by simply passing the bit stream through a low pass filter. Additionally, in a preferred embodiment of the present invention, it enables a very fine control over the relative delays of the modulation signal along the in-band modulation path and the out-of-band modulation path which enables very close matching of these delays to minimise phase errors which result from a poor matching of these delays. The fine control over the relative delays may be advantageously provided by having two address pointers for accessing data from the look-up table one of which supplies data from the look-up table to the in-band modulation path while the other supplies data from the look-up table to the out-of-band modulation path, whereby one pointer may access the same data from the look-up table at a slightly later or earlier period in time than the other pointer. The relative delay between the address pointers may either be set during initial design of the frequency synthesiser, during factory calibration or it may be dynamically set and adjusted under the control of a suitable digital controlling unit.

Where two pointers are used, the minimum resolution for delay compensation may be the period or cycle time used to read the look-up table. However, in a preferred embodiment, the minimum resolution can be further reduced down to the period of the comparison frequency or the reference frequency by storing the output values of the look-up table into FIFO-type stacked registers.

Additionally, according to a preferred embodiment of the present invention, there is further provided an Analogue to Digital Converter, ADC, connected between the input to the VCO and a digital controlling unit such as a MicroController Unit, MCU, or a Digital Signal Processor, DSP. By further providing a digital control signal from the digital controlling unit to the DAC it is possible to vary the gain of the DAC so that the transfer functions of the in-band and out-of-band modulations are well matched so as to provide an all pass transfer function for the synthesiser as a whole with a constant group delay versus frequency, regardless of the closed loop cut off frequency of the PLL (or in-band modulation bandwidth), which can thus be chosen to take optimum advantage of the noise shaping provided by the sequence generator regardless of the modulation bandwidth required.

BRIEF DESCRIPTION OF THE FIGURE

In order that the present invention may be better understood, an embodiment thereof will now be described by way of example only, with reference to the accompanying drawing in which the sole Figure is a schematic block diagram of a preferred embodiment of a direct modulation multi-accumulator fractional-N frequency synthesiser according to the present invention.

DETAILED DESCRIPTION OF A PREFERRED EMBODIMENT

The frequency synthesiser 1 shown in the Figure comprises a Phase Locked Loop (PLL) arrangement 10, 20, 30, 40, 41, 50, in-band modulation elements 21, 60, 61, 90 and out-of-band modulation elements 60, 70, 80, 90.

The PLL arrangement 10, 20, 30, 40, 41, 50 comprises a radio frequency Voltage Controlled Oscillator (VCO) 10, a variable divider 20, a phase (or frequency) discriminator 30, a loop filter 40, an adder 41 and a crystal oscillator circuit 50.

The in-band modulation elements comprise a multi-accumulator sequence generator 21 such as the one described in U.S. Pat. No. 5,166,642 or the ones described in co-pending European patent application Nos. EP98400805.2 and EP98400498.6. Note that the term multi-accumulator is intended to cover arrangements where more complicated elements such as multipliers are used instead of or in addition to one or more accumulators or where a processing element such as an MCU or DSP simulates the processing of a multi-accumulator sequence generator. Additionally, the in-band modulation elements comprise a frequency deviation look-up table 60, an adder 61 and a digital controlling unit 90 such as a MicroController Unit (MCU) or a Digital Signal Processor (DSP).

The out-of-band modulation elements comprise the look-up table 60, a variable gain Digital to Analogue Converter (DAC) 70, an Analogue to Digital Converter (ADC) 80 and the digital controlling unit 90.

Within the PLL arrangement, the VCO 10 outputs a modulated Radio Frequency (RF) signal 110 which in addition to forming the output of the frequency synthesiser 1 is input to the variable divider 20. The variable divider 20 divides down the modulated RF signal 110 to generate a divided down signal 120 which is fed into a first input 28 of the phase discriminator 30. The crystal oscillator circuit 50 generates a stable fixed frequency (Fref) reference signal 150 which is input to a second input 29 of the phase discriminator 30. The phase discriminator compares the phases of the two signals 120,150 input to it and outputs an analogue voltage signal 130 which is representative of the phase difference between the input signals 120, 150. As is well known in the art of PLL arrangements, the signal 130 is such as to cause the output of the VCO 10 to adjust its frequency to minimise any change in the relative phase difference between the input signals 120, 150 to the phase discriminator 30. In this way a constant phase difference is established between the input signals 120, 150 which, of course, corresponds to the input signals 120, 150 having the same frequency (Fref) as one another.

Before the signal 130 output from the phase discriminator is applied to the VCO 10 however, it is passed through the low pass filter 40 which has the effect of averaging the output signal 130 from the phase discriminator 30 in respect of fluctuations in the output signal 130 occurring at a frequency greater than the corner frequency of the low pass filter. In this way, rapidly fluctuating variations in the variable divider will have the net effect of causing the VCO 10 to output a signal at a frequency equal to the average value of the divisor of the variable divider in respect of fluctuations in the divisor occurring at a frequency above the cut-off frequency of the low pass filter response of the closed PLL. In this way it is possible to generate frequencies at the output of the VCO 10 which are not an integer multiple of the frequency Fref of the reference signal 150, even though the variable divider is only capable of dividing the modulated RF signal 110 by an integer amount at any instant in time.

The in-band modulation elements are arranged to provide an in-band modulation path comprising the look-up table 60, a digital adder 61 which receives at a first input thereto data from the look-up table 60 according to a first address pointer, the multi-accumulator sequence generator 21 which receives data from the digital adder 61 and outputs a sequence of numbers to the variable divider 20 which control the divisor of the variable divider 20 and thereafter the remaining elements in the PLL arrangement between the variable divider 20 and the VCO 10. The controlling unit 90 outputs channel select data to a second input of the digital adder 61. In this way the data input to the sequence generator represents, in a digital format, the modulated RF signal 110.

The out-of-band modulation elements are arranged to provide an out-of-band modulation path comprising the look-up table 60, the variable DAC 70, which receives data from the look-up table 60 and outputs an analogue modulation signal 170 (which represents in an analogue manner the modulation signal to be applied to the carrier signal to generate the modulated RF signal 110), and analogue voltage adder 41, which combines the output of the low pass filter 40 with the output of the variable DAC 70 to generate a VCO control signal 141 (which controls the frequency of the modulated RF signal 110 output by the VCO 10). The additional out-of-band modulation elements comprise the ADC 80 which receives the VCO control signal 141 as an input and outputs a digital representation of this signal to the controlling unit 90. The controlling unit 90 generates a DAC control signal 190 which controls the gain of variable gain DAC 70. The additional out-of-band modulation elements are arranged as an auto-calibration loop.

The operation of the above described frequency synthesiser 1 of the sole FIGURE will now be described below. The data bit stream 100 to be transmitted (by the radio transmitter of which the frequency synthesiser 1 is adapted to form a part) is input to the look-up table 60. The look-up table 60 comprises a memory which stores digital representations of various different possible combinations of input bit streams. For example, it might store $2^4$ sequences which represent the optimum modulation signal for representing pairs of bits having given preceding and following bits (e.g. sequence 1 might represent the bits 00 having a preceding bit 0 and a following bit 0, while a slightly different sequence (sequence 2) would represent the bits 00 when preceded by a bit 0 but when followed by a bit 1). The look-up table also requires control logic for controlling at least one address pointer for selecting which memory location (or locations) are output from the look-up table at any particular instant in time. Note that in an alternative embodiment, the look-up table 60 could be replaced with a standard digital filter such as an FIR for example.

As an example, in which only one address pointer is used, the memory part of the look-up table 60 can be envisaged as a matrix of, for example, $2^8$ memory locations arranged as $2^4$ rows and $2^4$ columns, each memory location storing a multi-bit number. Each row contains a single sequence (sequence 1–16), each sequence having a length of 16 multi-bit numbers. Each memory location can be envisaged as having an 8 bit address, the 4 most significant bits addressing the row in question and the 4 least significant bits addressing the column. As bits are received by the look-up table 60 at a first clock rate they can pass through a serial register 4 bits of which can then be used to generate the row address (the 4 bits in question comprising the 2 bits to be represented by the modulating signal and 1 bit either side). 2 periods later (referring to the first clock rate) a new row address will be generated (in which the last 2 bits will be those which formed the first 2 bits of the previous address code). Meanwhile, the address pointer will move along the addressed row at a second clock rate (which in this example will be 8 times the first clock rate) in order to output each of the multi-bit numbers contained in the sequence stored in the addressed row to both the digital adder 61 and the DAC 70.

In a preferred embodiment, however, two separate connections are made from the look-up table 60 to the digital adder 61 and the DAC 70 respectively with two separate address pointers being used in such a way that it is possible to provide a variable relative delay between the output from the look-up table to the adder 61 and to the DAC 70. Alternatively, one or more separate variable delay elements could be inserted in either or both of the modulation paths such as stacked registers. The control over the variable relative delay between the modulation paths is preferably under the control-of the controlling unit 90.

Considering firstly the in-band modulation path, the multi-bit numbers output by the look-up table form a digital representation of the modulation signal and are added to a digital representation of the channel frequency selected by the controlling unit 90. The signal 161 output from adder 61 is thus a digital representation of the modulated RF signal to be output by the VCO 10. This signal 161 is applied to the multi-accumulator sequence generator 21 at the second clock rate where it is converted into an equivalent signal 121 output from the sequence generator 21. The equivalent signal 121 has a smaller bit-width than the signal 161, but is output at a third clock rate which is higher than (or at least equal to) the second clock rate. The equivalent signal 121 is applied to the PLL arrangement, via the variable divider 20, which acts to filter out high frequency out-of-band components of the equivalent signal 121. The out-of-band components of the equivalent signal 121 will comprise a good deal of noise, as a result of the noise shaping characteristics of the sequence generator, together with any out-of-band components of the modulation signal. Simultaneously, along the out-of-band modulation path, the multi-bit numbers output by the look-up table (which form a digital representation of the modulation signal) are applied to the DAC 70 which outputs an analogue signal 170 representative of the modulation signal. This signal is then applied to the PLL arrangement via analogue adder 41which is located after the low pass filter 40 such that out-of-band frequency components of the modulation are not removed by the low pass filter 40 (note, this adder function can conveniently be realised by using two separate tuning ports on the VCO). However, the PLL arrangement does act to remove any low frequency, in-band components of the analogue signal 141 applied to the VCO 10 as a result of the "locking" of the PLL arrangement.

The frequency synthesiser 1 additionally comprises an auto-calibration loop comprising the ADC 80, the controlling unit 90 and the variable gain DAC 70. The auto-calibration loop is especially important where the frequency synthesiser is adapted to operate across a wide range of channel frequencies; and especially where the VCO 10 is highly non-linear (in term of its control slope). This is frequently the case in PLL arrangements because there is no need to use an expensive linear VCO for very good in-band operation of the PLL. The auto-calibration loop operates by enabling the controlling unit to measure the change in voltage required to make the VCO 10 generate adjacent or near-adjacent channel frequencies at different regions within the full operating range of the frequency synthesiser. In other words, it is possible to measure the gain of the VCO 10, $Kvco(f)=\Delta f/\Delta V$, where f is the frequency of the signal output by the VCO 10 and V is the voltage applied to the VCO 10.

Information about Kvco at different frequencies in the range of the VCO 10 can conveniently be stored in a look-up table and updated periodically by the controller. Provided Kvco is known for any channel at which the frequency synthesiser 1 might operate, it is straightforward for the controlling unit 90 to ensure that the gain of the DAC 70 is such that a value output by the look-up table 60 corresponds to the same frequency deviation for both the in-band and out-of-band modulation paths. This is so because the VCO is approximately linear for the small variations associated with the modulation signal as opposed to the large variations caused by moving between widely separated channels.

What is claimed is:

1. A direct modulation multi-accumulator fractional-N frequency synthesiser for generating a carrier signal modulated by a modulation signal, the frequency synthesiser comprising a Voltage Controlled Oscillator, VCO, having a tuning port for controlling the frequency of the signal output by the VCO, a variable divider and a multi-accumulator sequence generator for controlling the variable divider, a reference signal generator, a phase detector and a low pass filter, these elements being arranged to form a Phase Locked Loop arrangement, the directly modulated output signal of which is taken from the output of the VCO, wherein in-band modulation is performed by varying the variable divider and out-of-band modulation is performed by directly applying the modulation signal to the VCO tuning port, and wherein the modulation signal is provided as a digital signal both to the sequence generator and to a Digital to Analogue Converter, DAC, the output of which is combined with the output from the low pass filter before being applied to the VCO and wherein the DAC has a variable gain which is preferably controllable by means of a suitable digital control signal.

2. A direct modulation multi-accumulator fractional-N frequency synthesiser for generating a carrier signal modulated by a modulation signal, the frequency synthesiser comprising a Voltage Controlled Oscillator, VCO, having a tuning port for controlling the frequency of the signal output by the VCO, a variable divider and a multi-accumulator sequence generator for controlling the variable divider, a reference signal generator, a phase detector and a low pass filter, these elements being arranged to form a Phase Locked Loop arrangement, the directly modulated output signal of which is taken from the output of the VCO, wherein in-band modulation is performed by varying the variable divider and out-of-band modulation is performed by directly applying the modulation signal to the VCO tuning port wherein the modulation signal is provided as a digital signal both to the sequence generator and to a Digital to Analogue Converter, DAC, the output of which is combined with the output from the low pass filter before being applied to the VCO and wherein the digital modulating signal is provided by a look-up table to which a bit stream is input.

3. A direct modulation multi-accumulator fractional-N frequency synthesiser for generating a carrier signal modulated by a modulation signal, the frequency synthesiser comprising a Voltage Controlled Oscillator, VCO, having a tuning port for controlling the frequency of the signal output by the VCO, a variable divider and a multi-accumulator sequence generator for controlling the variable divider, a reference signal generator, a phase detector and a low pass filter, these elements being arranged to form a Phase Locked Loop arrangement, the directly modulated output signal of which is taken from the output of the VCO, wherein in-band modulation is performed by varying the variable divider and out-of-band modulation is performed by directly applying the modulation signal to the VCO tuning port wherein the modulation signal is provided as a digital signal both to the sequence generator and to a Digital to Analogue Converter, DAC, the output of which is combined with the output from the low pass filter before being applied to the VCO and wherein the digital modulation signal is provided by a look-up table to which a bit stream is input and further comprising delay means for varying the relative delay of the modulation signal along an out-of-band path compared to an in-band modulation path.

4. A direct modulation multi-accumulator fractional-N frequency synthesiser for generating a carrier signal modulated by a modulation signal, the frequency synthesiser comprising a Voltage Controlled Oscillator, VCO, having a tuning port for controlling the frequency of the signal output by the VCO, a variable divider and a multi-accumulator sequence generator for controlling the variable divider, a reference signal generator, a phase detector and a low pass filter, these elements being arranged to form a Phase Locked Loop arrangement, the directly modulated output signal of which is taken from the output of the VCO, wherein in-band modulation is performed by varying the variable divider and out-of-band modulation is performed by directly applying the modulation signal to the VCO tuning port wherein the modulation signal is provided as a digital signal both to the sequence generator and to a Digital to Analogue Converter, DAC, the output of which is combined with the output from the low pass filter before being applied to the VCO and wherein the digital modulation signal is provided by a look-up table to which a bit stream is input and further comprising delay means for varying the relative delay of the modulation signal along an out-of-band path compared to an in-band modulation path and wherein the delay means comprises a first address pointer for outputting data from the look-up table along the out-of-band modulation path, a second address pointer for outputting data from the look-up table along the in-band modulation path and controlling means for controlling the relative delay between the first and second address pointers outputting the same data from the look-up table.

5. A frequency synthesiser as claimed in claim 3 wherein the delay means includes a plurality of stacked registers.

6. A frequency synthesiser as claimed in claim 1 further comprising an Analogue to Digital Converter, ADC, connected between the input to the VCO and a digital controlling unit, whereby the gain of the VCO may be calculated as a function of the operating frequency of the VCO.

7. A frequency synthesiser as claimed in claim 6 further comprising gain control means for varying the amplitude of the signal applied to the VCO for performing the out-of-band modulation.

8. A frequency synthesiser as claimed in claim 7, wherein the gain control means comprises the DAC, wherein the gain of the DAC is controlled by the digital controlling unit.

9. A frequency synthesiser as claimed in claim 1 wherein the digital modulating signal is provided by a look-up table to which a bit stream is input.

10. A frequency synthesiser as claimed in claim 9 further comprising an Analogue to Digital Converter, ADC, connected between the input to the VCO and a digital controlling unit, whereby the gain of the VCO may be calculated as a function of the operating frequency of the VCO.

* * * * *